US012618875B2

(12) United States Patent
Pavlov

(10) Patent No.: US 12,618,875 B2
(45) Date of Patent: May 5, 2026

(54) CURRENT SENSOR WITH MAGNETIC AND RESISTIVE SENSING AND SHARED CALIBRATION

(71) Applicant: Allegro MicroSystems, LLC, Manchester, NH (US)

(72) Inventor: Emil Pavlov, Heidelberg (DE)

(73) Assignee: Allegro MicroSystems, LLC, Manchester, NH (US)

( * ) Notice: Subject to any disclaimer, the term of this patent is extended or adjusted under 35 U.S.C. 154(b) by 167 days.

(21) Appl. No.: 18/673,400

(22) Filed: May 24, 2024

(65) Prior Publication Data

US 2025/0362325 A1    Nov. 27, 2025

(51) Int. Cl.
*G01R 15/14*        (2006.01)
*G01R 35/00*        (2006.01)

(52) U.S. Cl.
CPC ......... *G01R 15/148* (2013.01); *G01R 35/005* (2013.01)

(58) Field of Classification Search
CPC ........................... G01R 15/148; G01R 35/005
See application file for complete search history.

(56) References Cited

U.S. PATENT DOCUMENTS

| | | |
|---|---|---|
| 7,476,816 B2 | 1/2009 | Doogue et al. |
| 8,604,777 B2 | 12/2013 | Doogue et al. |
| 9,234,919 B2 * | 1/2016 | Mandic .............. G01R 19/0092 |
| 10,247,758 B2 | 4/2019 | Milano et al. |

| | | |
|---|---|---|
| 10,380,879 B2 | 8/2019 | Haas et al. |
| 10,481,181 B2 | 11/2019 | Bussing et al. |
| 10,580,289 B2 | 3/2020 | Haas et al. |
| 10,718,794 B2 | 7/2020 | El Bacha et al. |
| 10,725,100 B2 | 7/2020 | Milano et al. |
| 10,914,765 B1 | 2/2021 | Bussing et al. |
| 11,163,021 B2 | 11/2021 | Friedrich et al. |
| 11,187,724 B2 | 11/2021 | Tsukahara et al. |
| 11,226,382 B2 | 1/2022 | Augendre et al. |
| 11,555,832 B2 | 1/2023 | Friedrich et al. |
| 11,680,996 B2 | 6/2023 | Pepka et al. |

(Continued)

OTHER PUBLICATIONS

U.S. Appl. No. 18/450,494, filed Aug. 16, 2023, Hein, et al.

(Continued)

*Primary Examiner* — Walter L Lindsay, Jr.
*Assistant Examiner* — Milton Gonzalez
(74) *Attorney, Agent, or Firm* — DALY, CROWLEY, MOFFORD & DURKEE, LLP

(57)        ABSTRACT

A current sensor for sensing a current through a conductor includes a magnetic field sensing element configured to generate a magnetic field signal indicative of a magnetic field associated with the current through the conductor, a first processing path responsive to the magnetic field signal and configured to generate a first current sensor output signal, a resistive element coupled to the conductor, a second processing path coupled across the resistive element and configured to measure a voltage across the resistive element and generate a second current sensor output signal, and a shared processor configured to calibrate the first processing path and second processing path. The shared processor can be configured to generate one or more of a sensitivity calibration signal, a temperature calibration signal, an offset calibration signal, or a lifetime drift calibration signal.

19 Claims, 8 Drawing Sheets

(56) References Cited

U.S. PATENT DOCUMENTS

| | | | | |
|---|---|---|---|---|
| 11,846,657 B2 * | 12/2023 | Kita | .................. | G01R 19/2506 |
| 2013/0015843 A1 | 1/2013 | Doogue et al. | | |
| 2013/0293224 A1 | 11/2013 | Kotera et al. | | |
| 2018/0252748 A1 | 9/2018 | Wood et al. | | |
| 2019/0221549 A1 | 7/2019 | Hayashi et al. | | |
| 2020/0132725 A1 * | 4/2020 | Krummenacher | ..... | G01R 1/203 |
| 2021/0072309 A1 | 3/2021 | Guan et al. | | |
| 2021/0263079 A1 | 8/2021 | Scwarzberger et al. | | |
| 2023/0204682 A1 * | 6/2023 | Boury | ................ | G01R 31/3832 |
| | | | | 324/433 |
| 2023/0332965 A1 | 10/2023 | Casu et al. | | |
| 2024/0036082 A1 * | 2/2024 | Lehmann | .............. | B60L 3/0046 |
| 2024/0036083 A1 * | 2/2024 | Lehmann | ............. | G01R 15/202 |
| 2024/0133926 A1 * | 4/2024 | Lee | .......................... | H04Q 9/00 |

OTHER PUBLICATIONS

Office Action dated May 24, 2022 for U.S. Appl. No. 17/189,480, 11 pages.
Response Office Action dated May 24, 2022 filed on Aug. 17, 2022 for U.S. Appl. No. 17/189,480, 17 pages.
Notice of Allowance dated Oct. 26, 2022 for U.S. Appl. No. 17/189,480, 9 pages.

* cited by examiner

300

304
BEGIN

308
INJECT A CALIBRATION CURRENT
THROUGH THE CONDUCTOR

312
MEASURE THE
VOLTAGE DROP
ACROSS THE SHUNT

316
MEASURE THE
HALL VOLTAGE

320
ADJUST THE GAIN OF BOTH SENSING
PATHS TO THE DESIRED SENSITIVITY

324
END

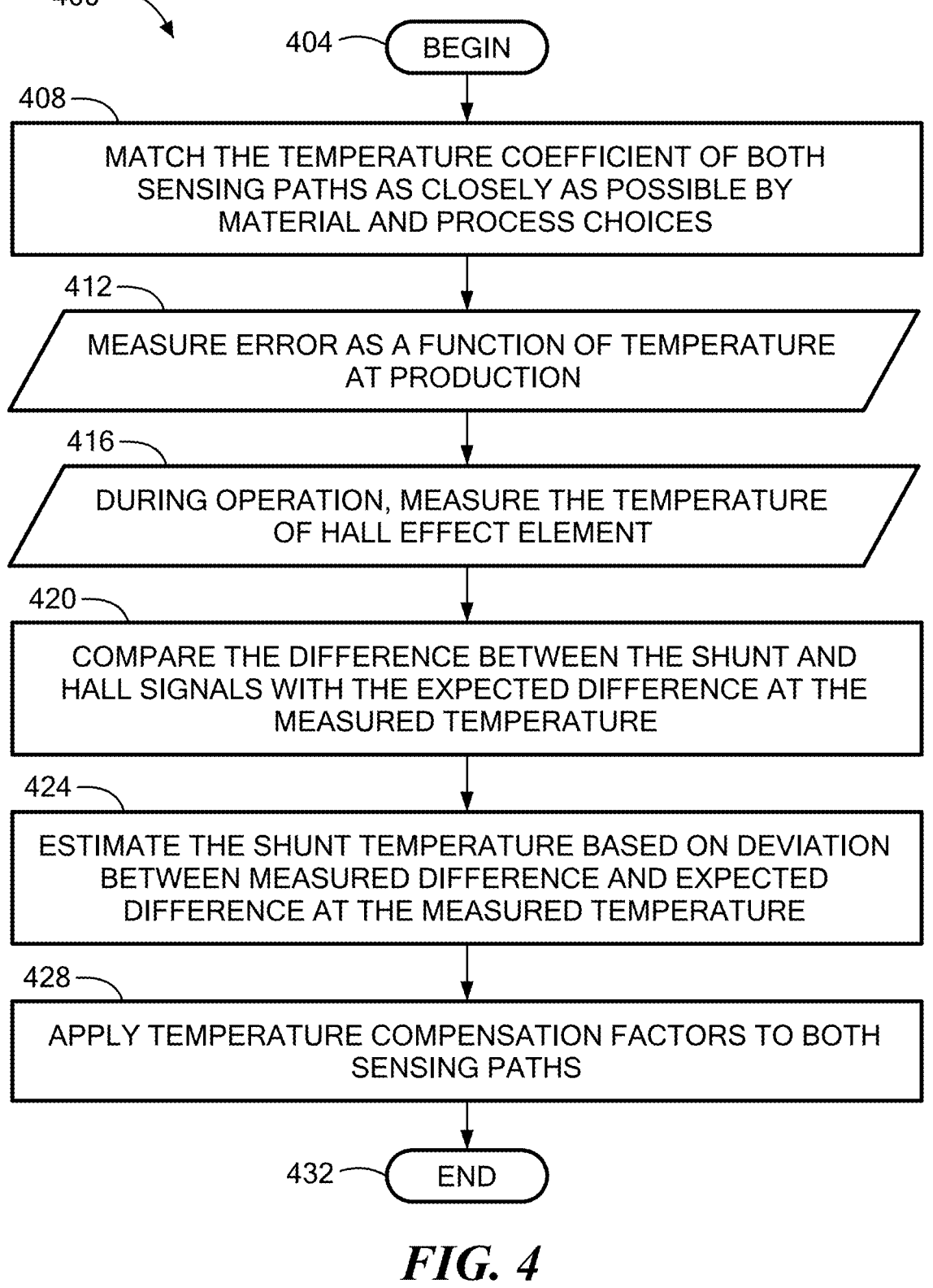

400

404 BEGIN

408 MATCH THE TEMPERATURE COEFFICIENT OF BOTH SENSING PATHS AS CLOSELY AS POSSIBLE BY MATERIAL AND PROCESS CHOICES

412 MEASURE ERROR AS A FUNCTION OF TEMPERATURE AT PRODUCTION

416 DURING OPERATION, MEASURE THE TEMPERATURE OF HALL EFFECT ELEMENT

420 COMPARE THE DIFFERENCE BETWEEN THE SHUNT AND HALL SIGNALS WITH THE EXPECTED DIFFERENCE AT THE MEASURED TEMPERATURE

424 ESTIMATE THE SHUNT TEMPERATURE BASED ON DEVIATION BETWEEN MEASURED DIFFERENCE AND EXPECTED DIFFERENCE AT THE MEASURED TEMPERATURE

428 APPLY TEMPERATURE COMPENSATION FACTORS TO BOTH SENSING PATHS

432 END

Figures 5, 6:
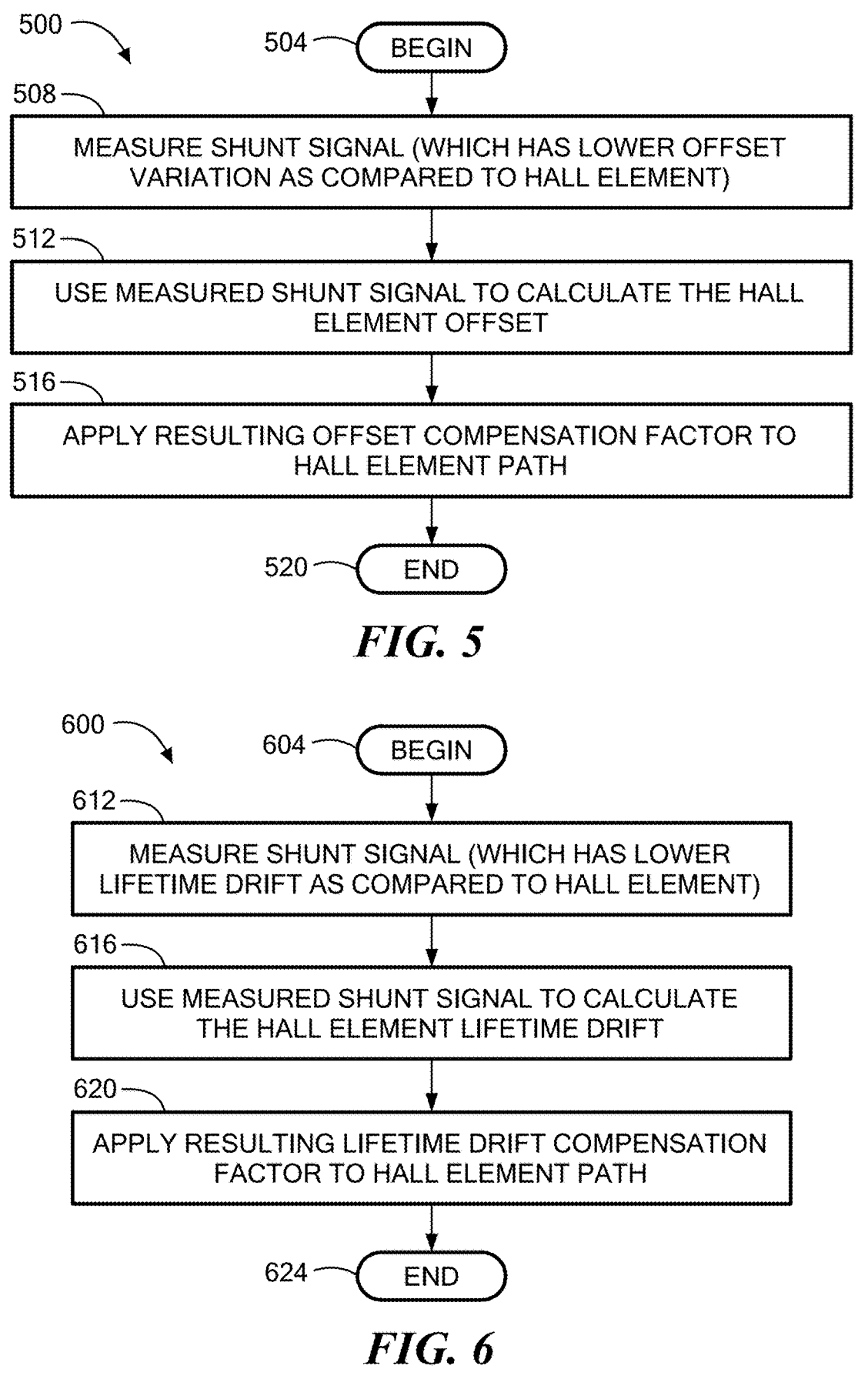

504 — BEGIN

508 —

MEASURE SHUNT SIGNAL (WHICH HAS LOWER OFFSET VARIATION AS COMPARED TO HALL ELEMENT)

512 —

USE MEASURED SHUNT SIGNAL TO CALCULATE THE HALL ELEMENT OFFSET

516 —

APPLY RESULTING OFFSET COMPENSATION FACTOR TO HALL ELEMENT PATH

520 — END

604 — BEGIN

612 —

MEASURE SHUNT SIGNAL (WHICH HAS LOWER LIFETIME DRIFT AS COMPARED TO HALL ELEMENT)

616 —

USE MEASURED SHUNT SIGNAL TO CALCULATE THE HALL ELEMENT LIFETIME DRIFT

620 —

APPLY RESULTING LIFETIME DRIFT COMPENSATION FACTOR TO HALL ELEMENT PATH

624 — END

CURRENT SENSOR WITH MAGNETIC AND RESISTIVE SENSING AND SHARED CALIBRATION

BACKGROUND

Current sensing sometimes includes one or more magnetic field sensing elements in proximity to a current-carrying conductor. The magnetic field sensing elements generate an magnetic field signal having a magnitude proportional to the magnetic field induced by the current through the conductor.

Another type of current sensing methodology includes measuring a voltage drop across the conductor in order to thereby determine the level of current flow through the conductor based on the measured voltage drop and known resistance of the conductor. Such current sensing can be referred to as resistive, or shunt sensing.

Current sensor integrated circuits (ICs) are often used in automotive control systems and other safety critical applications. There are a variety of specifications that set forth requirements related to permissible sensor quality levels, failure rates, and overall functional safety. One approach to meeting such mandates has been to use redundant, identical circuits in a sensor integrated circuit. Another approach to meeting a high level of safety standard compliance involves using more than one different (i.e., heterogenous) sensing elements, circuitry and/or methodologies.

Various error sources can adversely impact current sensor accuracy including sensitivity variations of the sensing elements, offset variations, effects temperature variations, and lifetime drift degradation. Sensitivity refers generally to the relationship between changes in the sensing element output in response and changes in the sensed current level. Offset refers to an electrical offset that can be introduced in the sensor output signal that can be attributable to various factors such as offset associated with sensing elements and signal processing circuitry. For example, some magnetic field sensing elements, such as Hall Effect elements, exhibit an undesirable DC offset voltage. Variations in the temperature to which a sensor is exposed and mechanical and other stresses on the sensor can also adversely impact sensor output signal accuracy.

SUMMARY

The present disclosure is directed to circuits and methods for providing shared processing between heterogeneous current sensing processing paths, such as magnetic field sensing and resistive sensing processing paths. Cost, circuit area, and power consumption efficiencies can be achieved by shared processing. Example shared processing can include one or more of sensitivity calibration, temperature calibration, offset calibration, or lifetime drift calibration.

According to the disclosure, a current sensor for sensing a current through a conductor includes a magnetic field sensing element configured to generate a magnetic field signal indicative of a magnetic field associated with the current through the conductor, a first processing path responsive to the magnetic field signal and configured to generate a first current sensor output signal, a resistive element coupled to the conductor, a second processing path coupled across the resistive element and configured to measure a voltage across the resistive element and generate a second current sensor output signal, and a shared processor configured to calibrate the first processing path and second processing path.

Features may include one or more of the following individually or in combination with other features. The shared processor can be configured to generate a sensitivity calibration signal. The sensitivity calibration signal includes a first sensitivity calibration signal based on a difference between the magnetic field signal and an expected magnetic field signal associated with a predetermined current through the conductor for coupling to the first processing path and a second sensitivity calibration signal based on a difference between the measured voltage across the resistive element and an expected voltage across the resistive element associated with the predetermined current through the conductor for coupling to the second processing path.

The shared processor can be configured to generate a temperature calibration signal. The magnetic field sensing element has a first temperature coefficient, the resistive element has a second temperature coefficient, and the magnetic field sensing element and the resistive element are selected so that the first temperature coefficient and the second temperature coefficient are substantially equal in value and opposite in polarity. The temperature sensing element is positioned adjacent to the magnetic field sensing element and configured to generate a temperature signal indicative of a measured temperature associated with the magnetic field sensing element, wherein the temperature signal is coupled to the shared processor. The temperature calibration signal includes a first temperature compensation signal based on a difference between the magnetic field signal and an expected magnetic field signal associated with the measured temperature for coupling to the first processing path and a second temperature compensation signal based on a difference between the measured voltage across the resistive element and an expected voltage across the resistive element associated with the measured temperature for coupling to the second processing path.

The shared processor can be configured to generate an offset calibration signal. The offset calibration signal is based on a measured voltage across the resistive element and is coupled to first processing path.

The shared processor can be configured to generate a lifetime drift calibration signal. The lifetime drift calibration signal is based on a measured voltage across the resistive element and is coupled to first processing path.

The first processing path can include a first front-end amplifier and the second processing path can include a second front-end amplifier and the calibration signal can be coupled to the first front end amplifier and to the second front end amplifier.

According to the disclosure, a method of calibrating a current sensor includes generating a magnetic field signal with a magnetic field sensing element, wherein the magnetic field signal is indicative of a magnetic field associated with a current through a conductor, generating a first current sensor output signal with a first processing path responsive to the magnetic field signal, coupling a resistive element to the conductor, measuring a voltage across the resistive element, generating a second current sensor output signal with a second processing path responsive to the measured voltage coupled across the resistive element, and calibrating the first processing path and the second processing path with a shared processor.

Features may include one or more of the following individually or in combination with other features. Calibrating the first processing path can include adjusting a sensitivity of the first processing path based on a difference between the magnetic field signal and an expected magnetic field signal associated with a predetermined current through the conductor for coupling to the first processing path and calibrating the second processing path can include adjusting a sensitivity of the second processing path based on a difference between the measured voltage across the resistive element and an expected voltage across the resistive element associated with the predetermined current through the conductor for coupling to the second processing path.

The method can further include providing the magnetic field sensing element with a first temperature coefficient, and providing the resistive element with a second temperature coefficient that is substantially equal in value and opposite in polarity with respect to the first temperature coefficient. The method can further include measuring a temperature associated with the magnetic field sensing element and adjusting the first processing path based on the measured temperature based on a difference between the magnetic field signal and an expected magnetic field signal associated with the measured temperature for coupling to the first processing path. The method can further include adjusting the second processing path based on a difference between the measured voltage across the resistive element and an expected voltage across the resistive element associated with the measured temperature.

The method can further include adjusting an offset the first processing path based on a measured voltage across the resistive element.

The method can further include adjusting a lifetime drift the first processing path based on a measured voltage across the resistive element.

BRIEF DESCRIPTION OF DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

FIG. 4 is a flow diagram illustrating a shared temperature calibration method according to the disclosure;

FIG. 5 is a flow diagram illustrating a shared offset calibration method according to the disclosure;

FIG. 6 is a flow diagram illustrating a shared lifetime drift calibration method according to the disclosure;

DETAILED DESCRIPTION

Figure 1:
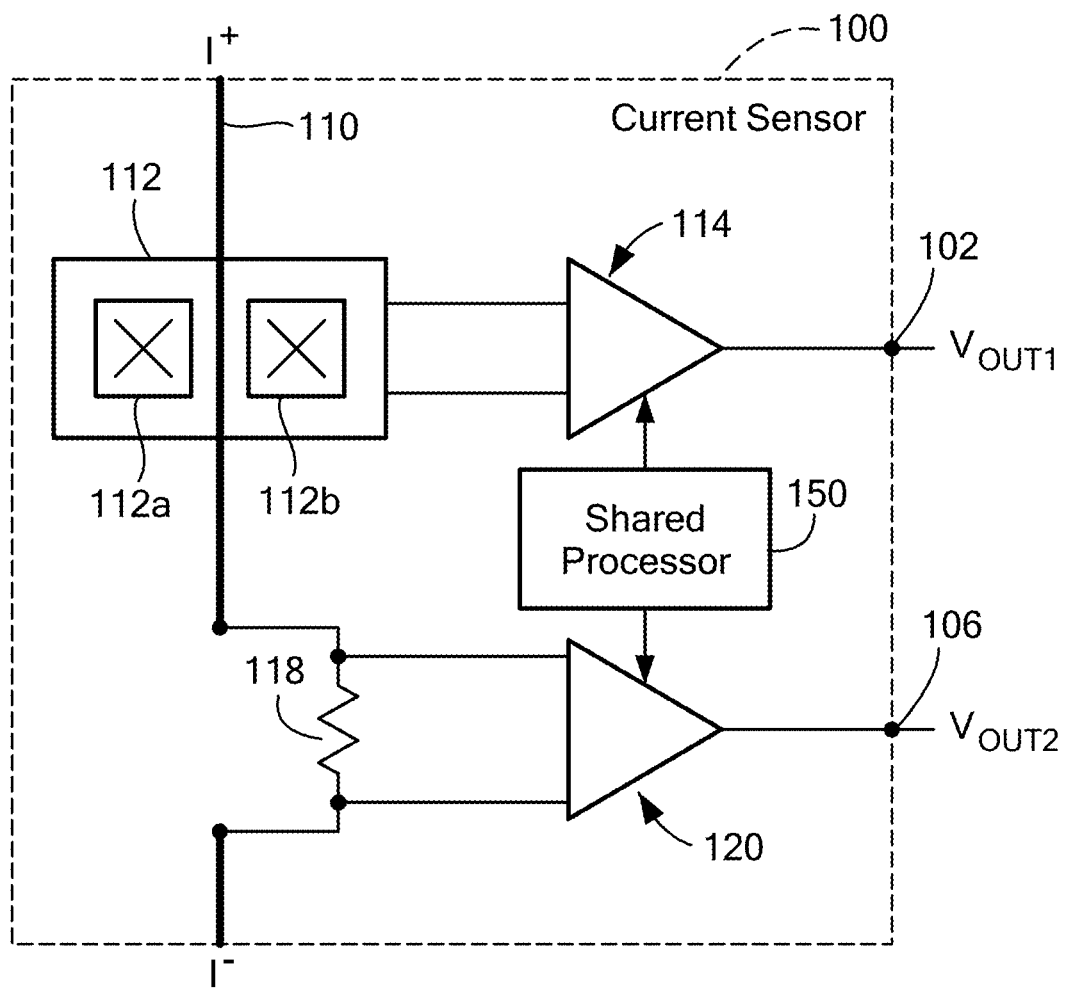
FIG. 1 is block diagram of a current sensor implementing magnetic and resistive sensing methodologies with shared processing according to the disclosure.

Referring to FIG. 1, a current sensor 100 for sensing a current through a conductor 110 includes magnetic field sensing elements 112 configured to generate a magnetic field signal indicative of a magnetic field associated with the current through the conductor, a first processing path 114 responsive to the magnetic field signal and configured to generate a first current sensor output signal VOUT1 102, a resistive element, or shunt resistor 118, coupled to the conductor, a second processing path 120 coupled across the resistive element and configured to measure a voltage across the resistive element and generate a second current sensor output signal VOUT2 106, and a shared processor 150 configured to calibrate both the first processing path and second processing path. In embodiments, the shunt resistor 118 can be provided as a portion of the conductor 110.

It will be appreciated that the two separate output signals VOUT1, VOUT2 generated using different current sensing methodologies provide heterogenous, redundant current sensing information that can be used to improve the safety and reliability of systems in which the current sensor 100 is used. For example, such heterogeneous, redundant current sensor output signals VOUT1, VOUT2 can satisfy certain safety standards, such as automotive safety integrity level (ASIL) requirements.

Processing paths 114, 120 can include various circuitry to process the magnetic field signal and the voltage across the resistive element 118, respectively. By way of non-limiting examples, processing circuitry can implement gain or sensitivity adjustment, offset adjustment, temperature adjustment, analog-to-digital conversion, etc.

Current sensor 100 including both magnetic field sensing elements 112 and resistive element 118 can be provided in the form of an integrated circuit (IC) and, in some cases, on a single semiconductor die.

Conductor 110 can be an integrated conductor, as may take the form of an interconnection of leads of a lead frame of the current sensor IC 100. Alternatively, conductor 110 can be external with respect to the sensor IC 100 and may take the form of a bus bar or conductive traces of a printed circuit board, as examples.

Magnetic field sensing elements 112 can include one or more magnetic field sensing elements 112a, 112b. In embodiments, magnetic field sensing elements 112a, 112b are Hall effect elements configured for differential sensing of the magnetic field generated by current through conductor 110. It will be appreciated by those of ordinary skill in the art however, that magnetic field sensing elements 112 can alternatively be one or more magnetoresistance elements or other types of magnetic field sensing elements and can include one or more individual elements arranged in various configurations, such as bridge configurations, for single-ended or differential magnetic field sensing. Magnetic field sensing elements 112 can include individual elements 112a, 112b that can be arranged and coupled to make a differential magnetic field measurement.

In some embodiments, the magnetic field current sensor 100 can be a coreless current sensor, meaning that it does not require a magnetic core around the conductor 110 to sense current. In other embodiments, a current sensor with a core may be used.

Figure 2:
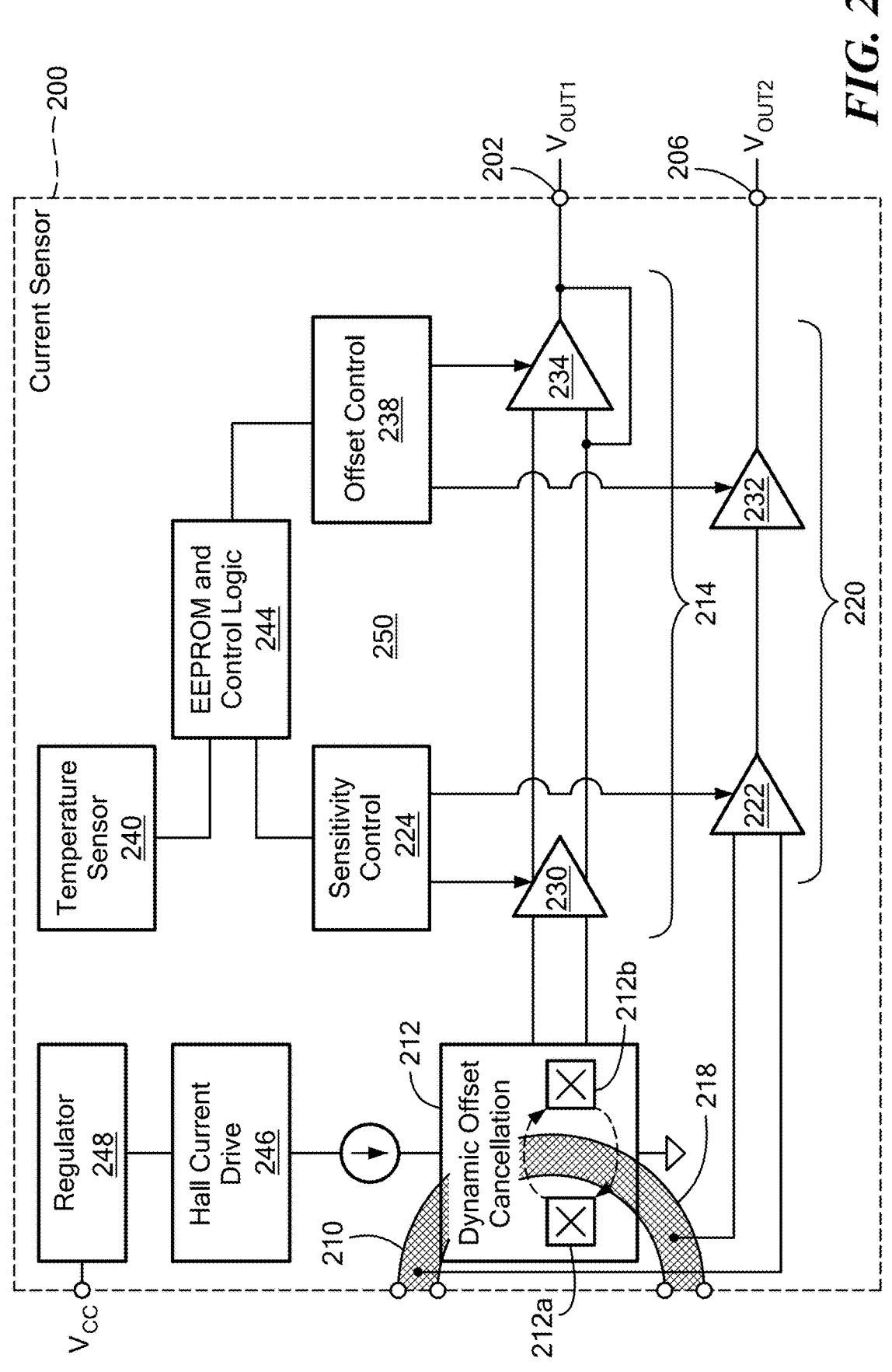
FIG. 2 is a more detailed block diagram of the current sensor of FIG. 1.

Referring also to FIG. 2, a current sensor 200 can be the same as or similar to the current sensor 100 of FIG. 1. To this end, current sensor 200 for sensing a current through a conductor 210 (that may be the same as or similar to conductor 110) includes magnetic field sensing elements 212 (that may be the same as or similar to magnetic field sensing elements 112), a first processing path 214 (that may be the same as or similar to first processing path 114) responsive to the magnetic field signal and configured to generate a first current sensor output signal VOUT1 202, a resistive element 218 (that may be the same as or similar to resistive element 118) coupled to the conductor, a second processing path 220 (that may be the same as or similar to second processing path 120) coupled across the resistive element and configured to measure a voltage across the resistive element and generate a second current sensor output signal VOUT2 206, and a shared processor 250 configured to calibrate both the first processing path 214 and second processing path 220. Block 212 can optionally implement dynamic offset cancellation techniques, such as chopping.

Shunt resistor 218 is electrically coupled to conductor 210 and in embodiments can be provided as a portion of the conductor so that measurement of the voltage across the shunt resistor, given knowledge of the resistance of the shunt resistor, is indicative of the current through the conductor.

In general, shared processor 250 can include various circuitry and processes with which calibration of both the magnetic field sensing signal path 214 and the shunt signal path 220 is performed. Elements of shared processor 250 can include a sensitivity control block 224, an offset control block 238, EEPROM and control logic block 244, and a temperature sensor 240, as will be explained.

Processing path 214 includes a differential amplifier 230 (sometimes referred to as a front-end amplifier) that can be coupled to receive the magnetic field signal from sensing elements 212. Amplifier 230 can have a variable gain controlled by sensitivity control block 224, which control is represented by the signal line from sensitivity control block 224 to amplifier 230. Processing path 214 can further include an offset adjustment element or network 234 with which offset can be corrected.

Processing path 220 includes a differential amplifier 222 that can be coupled to the shunt resistor 218 and configured to measure the voltage across the resistor. Amplifier 222 can have a variable gain controlled by sensitivity control block 224, which control is represented by the signal line from sensitivity control block 224 to amplifier 222. Processing path 220 can further include an offset adjustment element or network 232 with which offset can be corrected.

The current sensor 200 can include a regulator 248 to power various circuitry of the sensor. A Hall current drive 246 can provide a drive current to the magnetic field sensing elements 212.

According to an aspect of the disclosure, sensitivity control block 224 can be used to calibrate the sensitivity of both the first and second processing paths 214, 220, respectively. To this end, sensitivity control block 224 can generate a shared sensitivity calibration signal in the form of a first signal coupled between sensitivity control block 224 and amplifier 230 and a second signal coupled between sensitivity control block 224 and amplifier 222.

Figure 3:
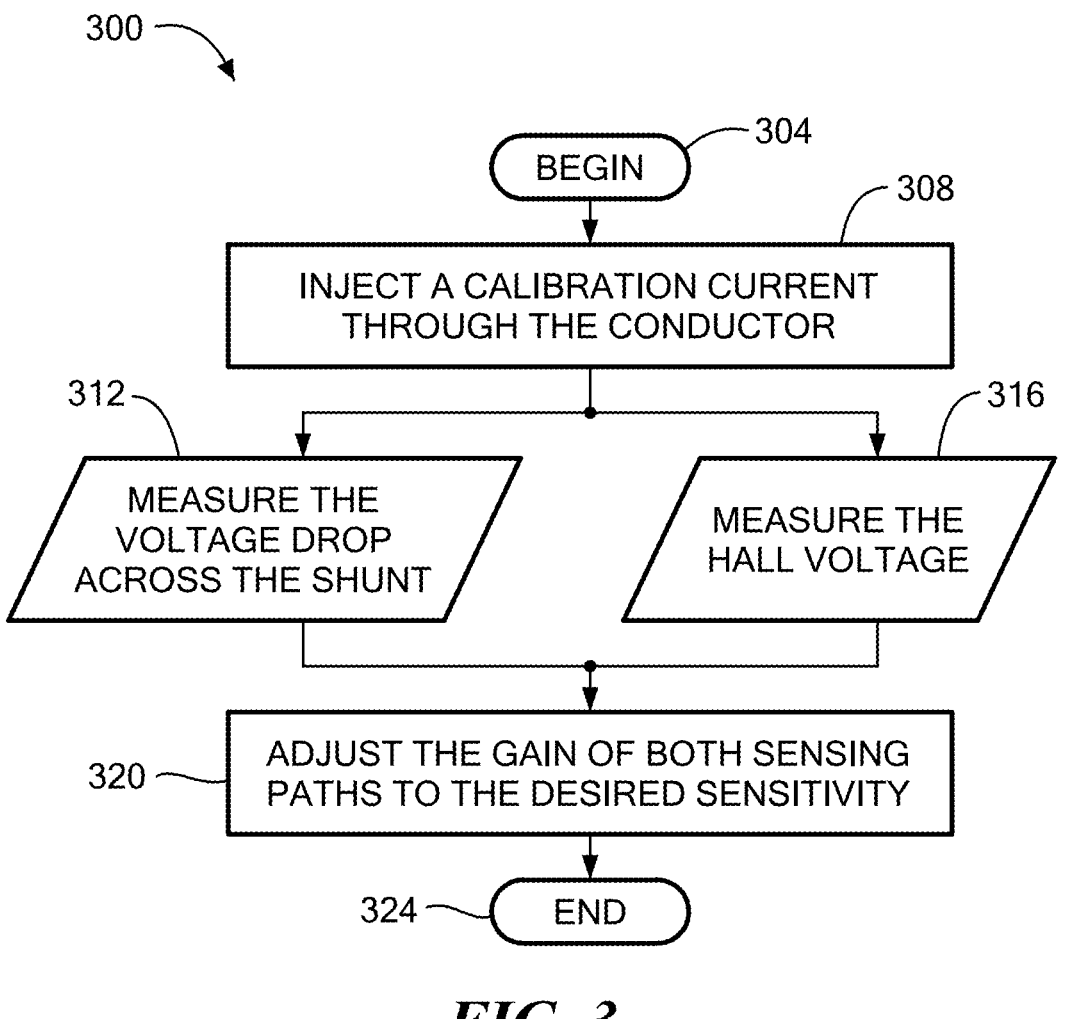
FIG. 3 is a flow diagram illustrating a shared sensitivity calibration method according to the disclosure.

Referring also to FIG. 3, an example shared sensitivity calibration process 300 commences at block 304. At block 308, a predetermined calibration current is injected through conductor 210 for a calibration time. Step 308 can be performed in a manufacturing setting and/or with the current sensor 200 installed in its intended system.

At block 312, the voltage drop across resistive element 218 (i.e., the shunt voltage) is measured, as may be measured by differential amplifier 222. At block 316, the voltage generated by the magnetic field sensing elements 212 is measured, as may be measured by amplifier 230. It will be appreciated by those of ordinary skill in the art that the measurements performed at blocks 312, 316 can be performed simultaneously, sequentially, or during overlapping time periods.

At block 320, the gain of both processing paths 214, 220 is adjusted, as may be controlled by sensitivity control block 224, following which the shared sensitivity calibration process terminates at block 324. More particularly, EEPROM and control logic block 244 can store values of expected measured signal levels corresponding to respective predetermined calibration currents, in so-called look-up table or other form or format. Such stored values can be preset, or user programmed. Such settings can be applied by adjusting the gain of the respective amplifiers 230, 222.

Sensitivity settings for each processing path 214, 220 can be determined and applied to the processing paths based on the difference between the measured signal values and the stored, expected signal values. For example, application of a predetermined calibration current of 50 amps can correspond to a first expected magnetic field signal level and a first expected shunt resistor voltage. A magnetic field sensitivity setting can be based on a difference between the measured magnetic field signal and the expected magnetic field signal level for the predetermined calibration current. Similarly, a shunt sensitivity setting can be based on a difference between the measured shunt resistor voltage and the expected shunt resistor voltage for the predetermined calibration current.

Stated differently, a shared sensitivity calibration signal includes a first sensitivity calibration signal provided by sensitivity control block 224 to magnetic field sensing path amplifier 230 based on a difference between the measured magnetic field signal and an expected magnetic field signal associated with the predetermined calibration current through the conductor 210 and a second sensitivity calibration signal provided by sensitivity control block 224 to shunt path amplifier 222 based on a difference between the measured voltage across the shunt resistor 218 and an expected voltage across the shunt resistor associated with the predetermined calibration current through the conductor 210.

With this arrangement, sensitivity calibration of both the magnetic field processing path 214 and the shunt resistor processing path 220 share the same calibration process. In other words, calibration of both processing paths is based on application of the same calibration current. Such shared sensitivity calibration advantageously avoids the need to independently calibrate both processing channels (e.g., avoids the need to measure the resistance of the shunt resistor 218).

Magnetic field sensing elements 212, such as Hall effect elements, have a negative temperature coefficient (i.e., the sensitivity of the sensing elements decreases with increasing temperature); whereas shunt resistor 218 has a positive temperature coefficient (i.e., the sensitivity of the shunt resistor increases with increasing temperature). According to an aspect of the disclosure, magnetic field sensing elements 212 and shunt resistor 218 can be designed to have the same or close to the same temperature coefficient magnitude, but opposite in polarity, based on material and other design choices.

Although the magnitude of the temperature coefficients of Hall effect sensing elements 212 and shunt resistor 218 can be brought close to each other (and in some cases the same as each other) based on design choices, additional temperature compensation can be advantageous in order to bridge any gap between the temperature coefficient magnitudes and in this way, enhance the accuracy of the current sensor output signals VOUT1, VOUT2 over temperature variations.

According to another aspect of the disclosure, shared temperature calibration is provided by a temperature sensor 240 in connection with EEPROM and control logic block 244 and sensitivity control block 224 in order to calibrate both the first and second processing paths 214, 220, respectively, for temperature variations. To this end, sensitivity control block 224 can generate a shared temperature calibration signal in the form of a first signal coupled between block 224 and amplifier 230 and a second signal coupled between block 224 and amplifier 222.

Temperature sensor 240 can take various forms, such as diode temperature sensing based on the generally predicable temperature dependent voltage drop across a forward-biased diode, transistor temperature sensing by measuring the temperature dependent base-emitter voltage of a transistor, a thermal probe, NTC thermistor, or thermocouple, and can be positioned proximate to sensing elements 212 in order to thereby provide a signal indicative of the temperature of the sensing elements 212.

Referring also to FIG. 4, an example shared temperature calibration process 400 commences at block 404. At block 408, the magnitude of the temperature coefficient of the magnetic field sensing element 212 and the temperature coefficient of the shunt resistor 218 are matched as closely as possible by design choices, such as by material and process choices.

At an optional block 412, the resulting mismatch between the temperature coefficients of the magnetic field sensing elements 212 and the shunt resistor 218 can be measured. For example, characterization of the temperature coefficient mismatch can be performed during production and can result in a determination that, even with design choices, there is still a mismatch between the temperature coefficient magnitudes of the magnetic field sensing elements 212 and the shunt resistor 218.

With knowledge of the characterized temperature coefficient mismatch, a residual temperature calibration factor can be computed and applied to both processing paths 214, 220 in order to account for the temperature coefficient mismatch. For example, such temperature coefficient mismatch characterization can determine that at a first, low temperature, the shunt voltage and the magnetic field signal are expected to differ from each other by a first voltage difference and at a second, higher temperature, the shunt voltage and the magnetic field signal are expected to differ from each other by a second voltage difference. The mismatch characterization can be used to determine temperature compensation factors for the shunt path 220 and for the Hall path 214, which factors may or may not have the same magnitude.

At block 416, during operation of current sensor 200, the temperature of the Hall effect elements 212 can be measured, for example by the temperature sensor 240 positioned proximate to the sensing elements.

At block 420, the voltage drop across resistive element 218 is measured, as may be measured by differential amplifier 222 and the voltage generated by the magnetic field sensing elements 212 is measured, as may be measured by amplifier 230. A difference between the measured shunt voltage and the measured magnetic field signal can be computed and compared to an expected difference between such signals at the measured temperature, as may be stored in EEPROM and control logic block 244.

More particularly, EEPROM and control logic block 244 can store values of expected measured magnetic field signal and shunt voltage levels corresponding to respective temperatures, such as in so-called look-up table or other form or format. Such stored values can be preset, or user programmed.

At block 424, the temperature of the shunt resistor 218 can be estimated based on the shunt output, the Hall output, and the measured IC temperature. Stated differently, the shunt resistor temperature can be estimated using the difference between the measured shunt voltage and the measured magnetic field signal and the expected difference between such signals at the measured temperature.

At block 428, based on the estimated shunt temperature and the measured Hall temperature, temperature coefficients for both signal paths are applied. A first temperature calibration factor can be applied to the magnetic field sensing processing path 214 and a second temperature calibration factor can be applied to the shunt processing path 220, following which the temperature compensation process terminates at block 432.

Stated differently, a shared temperature calibration signal includes a first sensitivity calibration signal provided by sensitivity block 224 to magnetic field sensing path amplifier 230 based on a difference between the magnetic field signal and an expected magnetic field signal associated with the measured temperature and a second temperature calibration signal provided by sensitivity block 224 to shunt path amplifier 222 based on a difference between the measured voltage across the resistive element and an expected voltage across the resistive element associated with the measured temperature.

With this arrangement, use of a single temperature sensor 240 that measures the temperature of the magnetic field sensing elements 212 is used for the additional purpose of temperature compensation of the shunt measurement path 220. This shared temperature calibration processing avoids the need to make two separate temperature measurements and significantly avoids the need to measure the temperature of the shunt resistor 218 which can be technically challenging.

In general, shunt resistor 218 can experience lower offset and resulting electrical offset errors than magnetic field sensing elements 212, such as Hall effect elements, when sensing lower currents (e.g., currents between 0 A and 5 A); whereas, magnetic field sensing elements 212 can experience lower offset and resulting electrical offset errors than shunt resistor 218 when sensing higher currents, for example due to lower heat losses than the shunt at such higher currents (e.g., currents between 5 A and 20 A).

According to an aspect of the disclosure, current sensing accuracy can be improved by choosing which methodology to use based on the range of currents to be detected and using the other, less accurate sensing methodology for redundancy purposes. In an example lower current application in which the shunt path 220 is considered to be the more accurate sensing methodology, measurement of the shunt voltage and comparison to an expected shunt voltage can be used to determine an offset calibration factor for the shunt path 220 and this shunt offset calibration factor can be used to determine an offset calibration factor for the magnetic field sensing path. On the other hand, in an example higher current application in which the magnetic field sensing path 214 is considered to be the more accurate sensing methodology, measurement of the magnetic field sensing element voltage and comparison to an expected magnetic field signal can be used to determine an offset calibration factor for the magnetic path 214 and this magnetic offset calibration factor can be used to determine an offset calibration factor for the shunt path.

Referring also to FIG. 5, an example shared offset calibration process 500 for a low current application commences at block 504. At block 508, the voltage across the shunt resistor 218 is measured.

At block 512, the measured shunt voltage is used to determine a shunt offset calibration factor. For example, the shunt offset calibration factor can be determined by comparing the measured shunt voltage to a stored expected shunt voltage. In step 516, the determined shunt offset calibration factor can be applied to the magnetic processing path 214 by the offset adjustment network 234 under the control of the offset control block 238 until processing ends in step 520. In this way, the lower offset experienced by the shunt path can be applied to the magnetic field sensing path in order to thereby offset the current sensor output signal VOUT1 accordingly.

Another factor that can affect accuracy of current sensor output signals VOUT1, VOUT2 can be referred to as lifetime drift and reflects accuracy degradation over the lifetime of the sensor 200. For example, Hall effect elements 212 are susceptible to a piezoelectric effect when the sensor IC package is stressed. In general, the shunt current sensing methodology suffers less from lifetime drift than the magnetic field sensing methodology.

According to an aspect of the disclosure, shared processor 250 can perform shared lifetime drift calibration of both the first and second processing paths 214, 220, respectively.

Referring also to FIG. 6, an example shared lifetime offset calibration process 600 commences at block 604, following which the shunt voltage is measured at block 612.

At block 616, the measured shunt voltage is used to calculate a lifetime drift calibration factor for the magnetic field sensing elements 212. This magnetic field lifetime drift factor can be determined by first determining a conductor current level at which the shunt voltage and magnetic field signal are expected to be the same or similar. Thereafter, when measuring a different conductor current level, it can be determined how much the magnetic field signal has drifted from the expected signal level. If the magnetic field signal has drifted by more than the amount that the shunt signal has drifted, then a correction factor can be applied to the magnetic field sensing path that is the same as the drift experienced by the shunt path 220. Stated differently, in this way, the Hall measurement can be periodically recalibrated to match the shunt which has a smaller lifetime drift and, in this way, the Hall based measurement is forced to have the same lifetime drift as the shunt measurement.

At block 620, the determined lifetime drift calibration factor for the magnetic sensing path 214 can be applied to the path, such as by adjusting the gain through control of amplifier 230 until processing completes in block 624. In this way, the accuracy of the magnetic field output signal VOUT1 can be improved.

With this arrangement, current sensing accuracy of the magnetic field sensing with sensing elements 212 and processing path 214 can be improved by referencing the lifetime drift of magnetic field sensing path 214 to that of shunt sensing path 220. Stated differently, the described shared lifetime drift calibration by which the lifetime drift of the magnetic field processing path 214 is forced to have the same (generally lower) lifetime drift as the shunt processing path 220, the lifetime steadiness of shunt sensing is applied to the magnetic field processing path 214.

Figure 7:
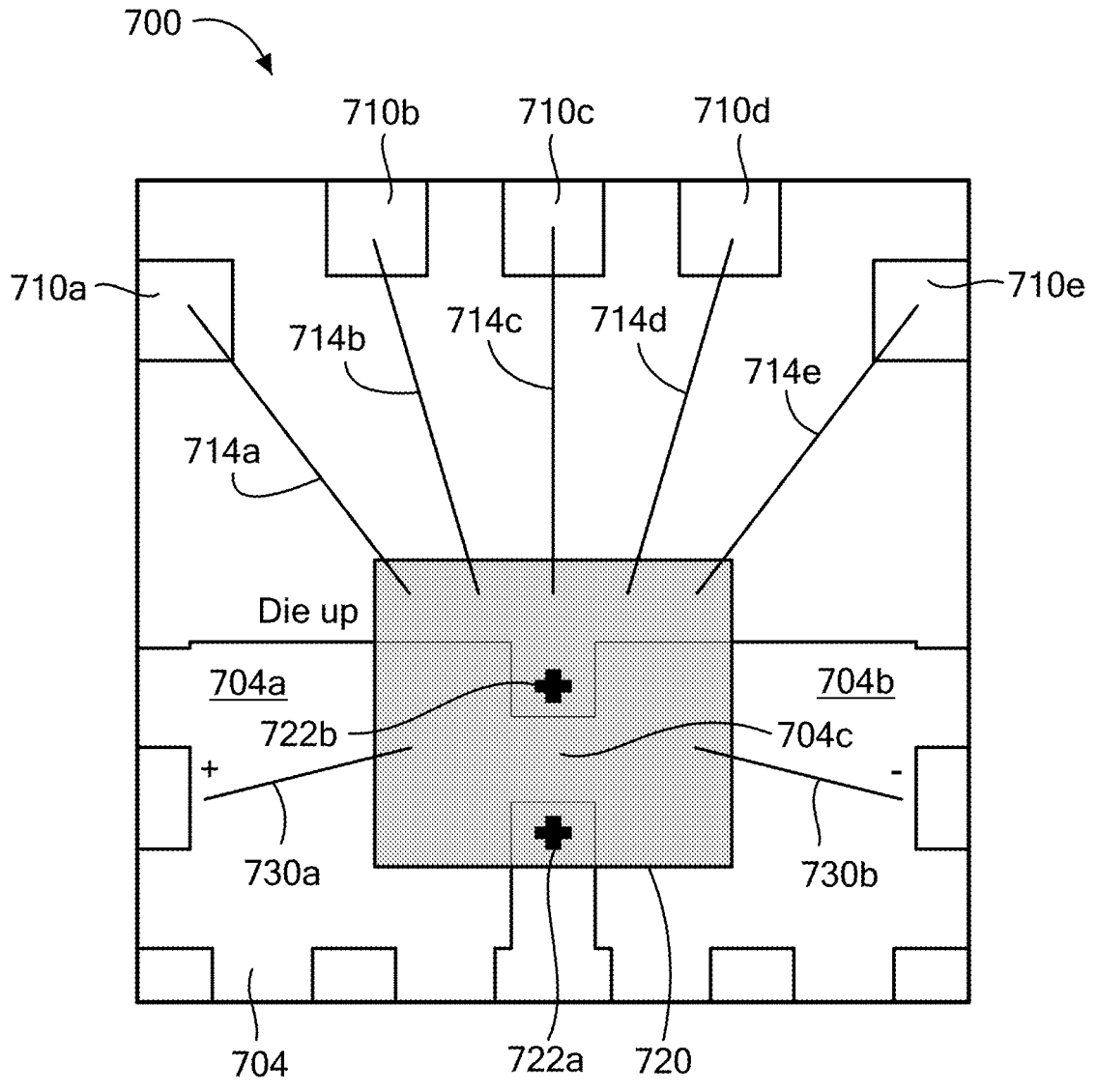
FIG. 7 is a plan view of an example current sensor integrated circuit according to the disclosure.

Referring to FIG. 7, an example current sensor IC 700 that can implement the above-described shared calibration processing for heterogeneous sensing paths (e.g., paths 214, 220) includes a lead frame 710 and a die 720 supported by the lead frame. Die 720 supports one or more magnetic field sensing elements 722a, 722b (that may be the same as or similar to sensing elements 212a, 212b). Sensing elements 722a, 722b and circuitry supported by the die 720 are electrically coupled to leads 710a-710e by wire bonds 714a-714e, respectively, as shown.

An integrated conductor (that may be the same as or similar to conductor 210) is provided by portions of the lead frame 710 including an input portion 704a into which a current flows, an output portion 704b from which the current flows, and an intermediate current portion 704c between the input portion and the output portion. Die 720 is attached to the lead frame 710 in a so-called "die up" configuration in which the sensing elements 722a, 722b are supported by a surface of the die distal from the lead frame. In embodiments, an insulation structure (not labeled) can be positioned between the die 720 and the lead frame 710 to provide electrical insulation.

Kelvin connections 730a, 730b are coupled between the die 720 and the integrated current conductor in order to provide an electrical contact to the conductor in a way that reduces effects of contact resistance. On the die 720, Kelvin connections 730a, 730b are coupled to a shunt resistor (e.g., shunt resistor 218).

Figure 8:
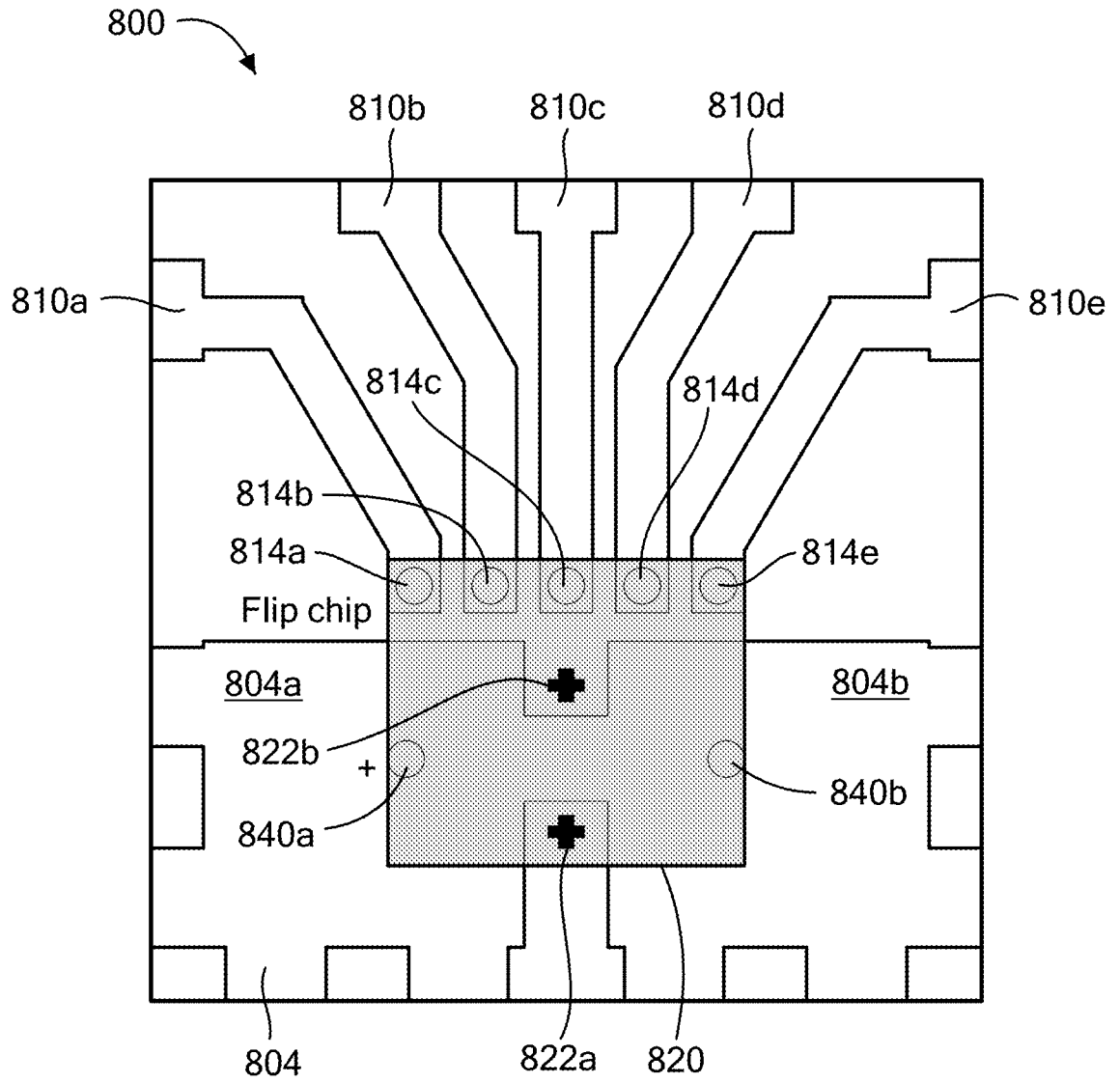
FIG. 8 is a plan view of an alternative example current sensor integrated circuit according to the disclosure.

FIG. 8 shows a plan view of an alternative example current sensor IC 800 that can implement the above-described shared calibration processing for heterogeneous processing paths (e.g., paths 214, 220) according to the disclosure. Like the current sensor IC 700 of FIG. 7, IC 800 includes a lead frame 810 and a die 820 supporting magnetic field sensing elements 822a, 822b. Here again, an integrated conductor (that may be the same as or similar to conductor 210) is provided by portions of the lead frame 810 including an input portion 804a into which a current flows, an output portion 804b from which the current flows, and an intermediate current portion 804c between the input portion and the output portion.

Current sensor IC 800 differs from current sensor 700 in that sensor IC 800 is a so-called "flip-chip" configuration in which the active surface of the die 820 that supports sensing elements 822a, 822b is proximate to the lead frame. Thus, electrical coupling of the sensing elements 822a, 822b and circuitry supported by the die 820 to leads 810a-810e is accomplished with solder bumps 814a-814e (rather than with wire bonds 714a-714e), as shown. In embodiments, an insulation structure (not labeled) can be positioned between the die 820 and the lead frame 810 to provide electrical insulation.

Further, Kelvin connections 840a, 840b are provided as solder bumps or other mechanisms for direct electrical contact to the current conductor portion of the lead frame 810. On die 820, Kelvin connections 840a, 840b are coupled to a shunt resistor (e.g., shunt resistor 218).

Figure 9:
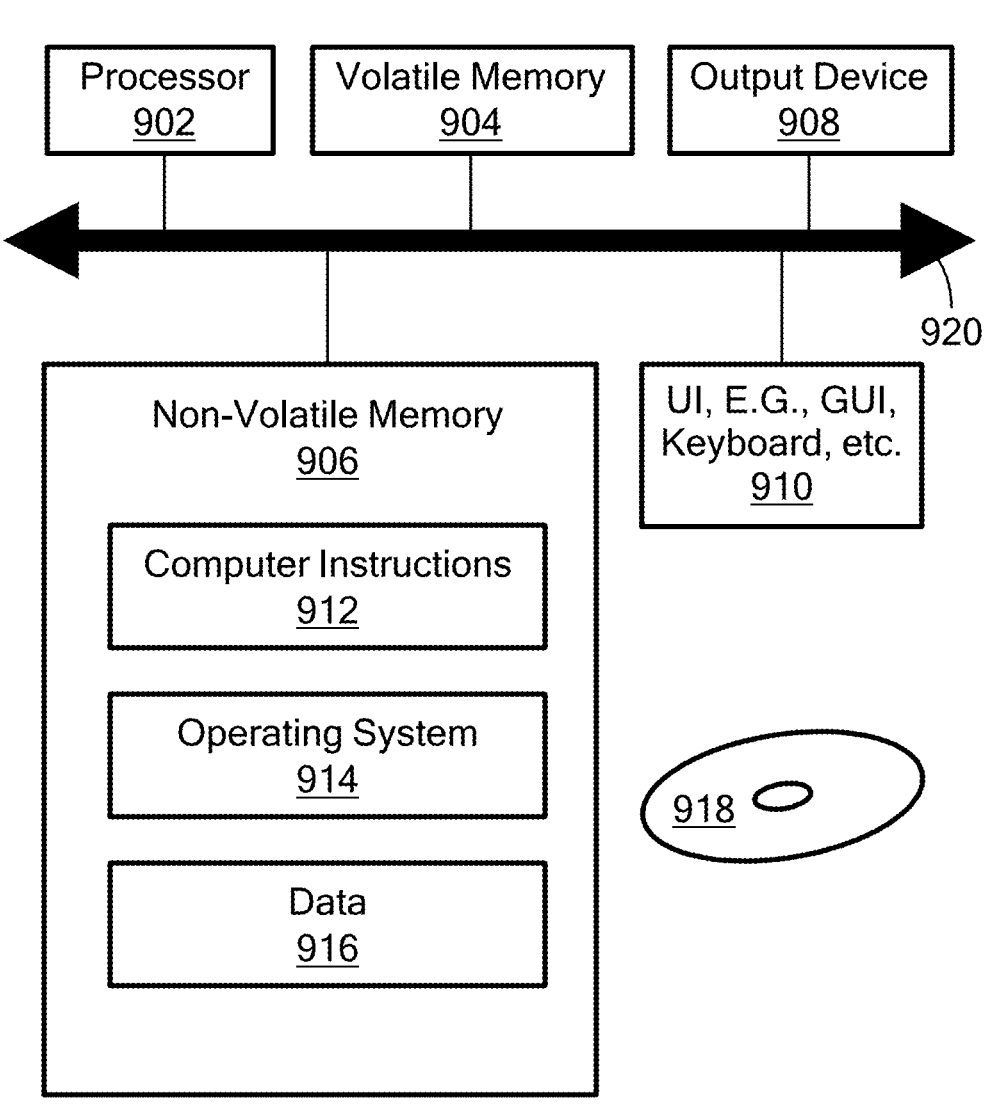
FIG. 9 is a block diagram of an example computer system operative to perform processing, in accordance with the present disclosure.

FIG. 9 is a block diagram of an example computer system 900 operative to perform processing, in accordance with the present disclosure. Computer system 900 can perform all or at least a portion of the processing, e.g., steps in the algorithms and methods, described herein. The computer system 900 includes a processor 902, a volatile memory 904, a non-volatile memory 906 (e.g., hard disk, EEPROM, OTP memory, etc.), an output device 908 and a user input or interface (UI) 910, e.g., graphical user interface (GUI), a mouse, a keyboard, a display, and/or any common user interface, etc. The non-volatile memory (non-transitory storage medium) 906 stores computer instructions 912 (a.k.a., machine-readable instructions or computer-readable instructions) such as software (computer program product), an operating system 914 and data 916. In some examples, the computer instructions 912 are executed by the processor 902 out of (from) volatile memory 904. In one embodiment, article 918 (e.g., a storage device or medium such as a hard disk, an optical disc, magnetic storage tape, optical storage tape, flash drive, etc.) includes or stores the non-transitory computer-readable instructions.

As used herein, the term "sensor" is used to describe a circuit that uses one or more sensing elements, generally in combination with other circuits. For example, the sensor can be a magnetic field sensor with one or more magnetic field sensing elements. The magnetic field sensor can be, for example, a rotation detector, a movement detector, or a proximity detector. A linear sensor can sense a magnetic field strength. A rotation detector (or movement detector) can senses passing target objects, for example, magnetic domains of a ring magnet or a ferromagnetic target (e.g., gear teeth) where the magnetic field sensor is used in combination with a back-bias or other magnet and can determine target movement speed. Also, linear arrangements of ferromagnetic objects are possible that move linearly.

As used herein, the term "magnetic field sensing element" is used to describe a variety of electronic elements that can sense a magnetic field. The magnetic field sensing element can be, but is not limited to, a Hall effect element, a magnetoresistance element, a magnetotransistor, or an inductive coil. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate or in the plane of the substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of maximum sensitivity perpendicular to a substrate, while metal based or metallic magnetoresistance elements (e.g., GMR, TMR, AMR) and vertical Hall elements tend to have axes of maximum sensitivity parallel to a substrate.

As used herein, the term "magnetic field signal" is used to describe any signal that results from a magnetic field experienced by a magnetic field sensing element.

As used herein, the terms "processor" and "controller" are used to describe elements that perform a function, an operation, or a sequence of operations. The function, operation, or sequence of operations can be hard coded into an electronic circuit or soft coded by way of instructions held in a memory device. The function, operation, or sequence of operations can be performed using digital values or using analog signals. In some embodiments, the processor or controller can be embodied in an application specific integrated circuit (ASIC), which can be an analog ASIC or a digital ASIC, in a microprocessor with associated program memory, in a discrete electronic circuit which can be analog or digital, and/or in special purpose logic circuitry (e.g., a field programmable gate array (FPGA)). Processing can be implemented in hardware, software, or a combination of the two. Processing can be implemented using computer programs executed on programmable computers/machines that include one or more processors, a storage medium or other article of manufacture that is readable by the processor (including volatile and non-volatile memory and/or storage elements), at least one input device and one or more output devices. Program code can be applied to data entered using an input device to perform processing and to generate output information. A processor or controller can contain internal processors or modules that perform portions of the function, operation, or sequence of operations. Similarly, a module can contain internal processors or internal modules that perform portions of the function, operation, or sequence of operations of the module.

It should be understood that a so-called "comparator" can be comprised of an analog comparator having a two-state output signal indicative of an input signal being above or below a threshold level (or indicative of one input signal being above or below another input signal). However, the comparator can also be comprised of a digital circuit having an output signal with at least two states indicative of an input signal being above or below a threshold level (or indicative of one input signal being above or below another input signal), respectively, or a digital value above or below a digital threshold value (or another digital value), respectively.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures but should be understood.

Also, the following definitions and abbreviations are to be used for the interpretation of the claims and the specification. The terms "comprise," "comprises," "comprising," "include," "includes," "including," "has," "having," "contains" or "containing," or any other variation are intended to cover a non-exclusive inclusion. For example, an apparatus, a method, a composition, a mixture, or an article, that includes a list of elements is not necessarily limited to only those elements but can include other elements not expressly listed or inherent to such apparatus, method, composition, mixture, or article.

References in the specification to "embodiments," "one embodiment," "an embodiment," "an example embodiment," "an example," "an instance," "an aspect," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it may affect such feature, structure, or characteristic in other embodiments whether explicitly described or not.

It is noted that various connections and positional relationships (e.g., over, below, adjacent, etc.) may be used to describe elements and components in the description and drawings. These connections and/or positional relationships, unless specified otherwise, can be direct or indirect, and the described concepts, systems, devices, structures, and techniques are not intended to be limiting in this respect. Accordingly, a coupling of entities can refer to either a direct or an indirect coupling, and a positional relationship between entities can be a direct or indirect positional relationship. As an example of an indirect positional relationship, positioning element "A" over element "B" can include situations in which one or more intermediate elements (e.g., element "C") is between elements "A" and elements "B" as long as the relevant characteristics and functionalities of elements "A" and "B" are not substantially changed by the intermediate element(s).

In the foregoing detailed description, various features of embodiments are grouped together in one or more individual embodiments for the purpose of streamlining the disclosure. This method of disclosure is not to be interpreted as reflecting an intention that the claims require more features than are expressly recited therein. Rather, inventive aspects may lie in less than all features of each disclosed embodiment. Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

Having described preferred embodiments of the present disclosure, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. A current sensor for sensing a current through a conductor, comprising:
   a magnetic field sensing element configured to generate a magnetic field signal indicative of a magnetic field associated with the current through the conductor;
   a first processing path responsive to the magnetic field signal and configured to generate a first current sensor output signal;
   a resistive element coupled to the conductor;
   a second processing path coupled across the resistive element and configured to measure a voltage across the resistive element and generate a second current sensor output signal; and
   a shared processor configured to calibrate the first processing path and second processing path.

2. The current sensor of claim 1, wherein the shared processor is configured to generate a sensitivity calibration signal.

3. The current sensor of claim 2, wherein the sensitivity calibration signal comprises:
   a first sensitivity calibration signal based on a difference between the magnetic field signal and an expected magnetic field signal associated with a predetermined current through the conductor for coupling to the first processing path; and
   a second sensitivity calibration signal based on a difference between the measured voltage across the resistive element and an expected voltage across the resistive element associated with the predetermined current through the conductor for coupling to the second processing path.

4. The current sensor of claim 1, wherein the shared processor is configured to generate a temperature calibration signal.

5. The current sensor of claim 4, wherein the magnetic field sensing element has a first temperature coefficient, the resistive element has a second temperature coefficient, and wherein the magnetic field sensing element and the resistive element are selected so that the first temperature coefficient and the second temperature coefficient are substantially equal in value and opposite in polarity.

6. The current sensor of claim 4, further comprising a temperature sensing element positioned adjacent to the magnetic field sensing element and configured to generate a temperature signal indicative of a measured temperature associated with the magnetic field sensing element, wherein the temperature signal is coupled to the shared processor.

7. The current sensor of claim 6, wherein the temperature calibration signal comprises:
   a first temperature compensation signal based on a difference between the magnetic field signal and an expected magnetic field signal associated with the measured temperature for coupling to the first processing path; and
   a second temperature compensation signal based on a difference between the measured voltage across the resistive element and an expected voltage across the resistive element associated with the measured temperature for coupling to the second processing path.

8. The current sensor of claim 1, wherein the shared processor is configured to generate an offset calibration signal.

9. The current sensor of claim 8, wherein the offset calibration signal is based on a measured voltage across the resistive element and is coupled to first processing path.

10. The current sensor of claim 1, wherein the shared processor is configured to generate a lifetime drift calibration signal.

11. The current sensor of claim 10, wherein the lifetime drift calibration signal is based on a measured voltage across the resistive element and is coupled to first processing path.

12. The current sensor of claim 1, wherein the first processing path comprises a first front-end amplifier and the second processing path comprises a second front-end amplifier and wherein the calibration signal is coupled to the first front end amplifier and to the second front end amplifier.

13. A method of calibrating a current sensor comprising:
   generating a magnetic field signal with a magnetic field sensing element, wherein the magnetic field signal is indicative of a magnetic field associated with a current through a conductor;
   generating a first current sensor output signal with a first processing path responsive to the magnetic field signal;
   coupling a resistive element to the conductor;
   measuring a voltage across the resistive element;
   generating a second current sensor output signal with a second processing path responsive to the measured voltage coupled across the resistive element; and calibrating the first processing path and the second processing path with a shared processor.

14. The method of claim 13, wherein calibrating the first processing path comprises adjusting a sensitivity of the first processing path based on a difference between the magnetic field signal and an expected magnetic field signal associated with a predetermined current through the conductor for coupling to the first processing path and wherein calibrating the second processing path comprises adjusting a sensitivity of the second processing path based on a difference between the measured voltage across the resistive element and an expected voltage across the resistive element associated with the predetermined current through the conductor for coupling to the second processing path.

15. The method of claim 13, further comprising:

providing the magnetic field sensing element with a first temperature coefficient; and providing the resistive element with a second temperature coefficient that is substantially equal in value and opposite in polarity with respect to the first temperature coefficient.

16. The method of claim 13, further comprising measuring a temperature associated with the magnetic field sensing element and adjusting the first processing path based on the measured temperature based on a difference between the magnetic field signal and an expected magnetic field signal associated with the measured temperature for coupling to the first processing path.

17. The method of claim 16, further comprising adjusting the second processing path based on a difference between the measured voltage across the resistive element and an expected voltage across the resistive element associated with the measured temperature.

18. The method of claim 13, further comprising adjusting an offset the first processing path based on a measured voltage across the resistive element.

19. The method of claim 13, further comprising adjusting a lifetime drift the first processing path based on a measured voltage across the resistive element.

\* \* \* \* \*